(12) United States Patent
Chang

(10) Patent No.: US 11,567,102 B2
(45) Date of Patent: Jan. 31, 2023

(54) AUXILIARY DEVICE FOR FUNCTIONAL EXPANSION AND SIGNAL ACQUISITION OF TESTING SYSTEM

(71) Applicant: Chien Wen Chang, Taoyuan (TW)

(72) Inventor: Chien Wen Chang, Taoyuan (TW)

( * ) Notice: Subject to any disclaimer, the term of this patent is extended or adjusted under 35 U.S.C. 154(b) by 681 days.

(21) Appl. No.: 16/559,708

(22) Filed: Sep. 4, 2019

(65) Prior Publication Data

US 2021/0063435 A1 Mar. 4, 2021

(51) Int. Cl.
*G01R 1/04* (2006.01)
*H01R 12/57* (2011.01)
*H01R 13/05* (2006.01)

(52) U.S. Cl.
CPC ........... *G01R 1/0416* (2013.01); *H01R 12/57* (2013.01); *H01R 13/05* (2013.01)

(58) Field of Classification Search
CPC ............ G01R 1/07314; G01R 1/06722; G01R 1/0416; H01R 12/57; H01R 13/05
USPC .................................. 439/482, 219; 438/445
See application file for complete search history.

(56) References Cited

U.S. PATENT DOCUMENTS

| 6,053,777 A * | 4/2000 | Boyle ............... H01R 13/2421 439/700 |
| 6,275,054 B1 * | 8/2001 | Boyle ................... H01R 24/44 324/755.05 |
| 10,197,598 B2 * | 2/2019 | Yui ..................... G01R 31/2808 |
| 2010/0062629 A1 * | 3/2010 | Feldman ........... G01R 31/2889 439/219 |
| 2012/0182034 A1 * | 7/2012 | Scherer .............. G01R 1/06722 324/755.05 |
| 2021/0278480 A1 * | 9/2021 | Kenzaki ............ G01R 1/06722 |

FOREIGN PATENT DOCUMENTS

CN 110716077 A * 1/2020

* cited by examiner

*Primary Examiner* — Marcus E Harcum

(57) ABSTRACT

An auxiliary device for functional expansion and signal acquisition of a testing system is provided with a pogo pin attaching device including at least one spiral spring loop, at least one fastening member, and at least one cable. The fastening member includes at least one limiting hole and at least one fastening hole. The spiral spring loop is disposed in the limiting hole. The cable passes through the fastening hole to electrically connect to the spiral spring loop.

6 Claims, 6 Drawing Sheets

AUXILIARY DEVICE FOR FUNCTIONAL EXPANSION AND SIGNAL ACQUISITION OF TESTING SYSTEM

BACKGROUND OF THE INVENTION

1. Field of the Invention

The invention relates to testing systems and more particularly to an auxiliary device for functional expansion and signal acquisition of an automatic testing system by attaching a spiral spring loop to a pogo pin interface of the automatic testing system so that an expansion instrument can be mounted with the pogo pin interface of the automatic testing system to implement functional expansion of the automatic testing system for system upgrade or signal acquisition of the automatic testing system to analyze for debugging.

2. Description of Related Art

Conventionally, in wafer fabrication, wafer sorting test or verification of the last packaging, it is possible that an automatic testing system may be incapable of fully supporting processes of the factory due to advancements of the technology or further production capacity requirements. Thus, the automatic testing system is required to be replaced with a more advanced one or be upgraded if possible. However, a number of problems occur as detailed below.

The supplier of the automatic testing system may not be fully aware of new applications of their clients. In the design stage of the automatic testing system, it is very difficult of predicting any potential applications and thus providing comprehensive means for future upgrades. Further, for the sake of saving the manufacturing costs and getting more profits, practically the supplier does not provide many additional expansion slots or auxiliary ports to the automatic testing system.

Due to hardware limitations of the automatic testing system, it is not always appropriate to integrate an expansion instrument by means of reforming probe card or probe carrier board.

Probe cards are required to scheduled maintenance for good performance. Thus, instrument cable disconnection and reconnection are required often if the expansion instrument is directly connected on probe card. Further, how to properly keep wiring in good condition, i.e., not making wiring messy, is an issue to be addressed.

However, in the debugging and analysis process of a conventional semiconductor auto testing system, there is no proper device for acquiring signals from a pogo pin interface of a testing system in real time for analyzing and solving testing problems.

Thus, the need for improvement still exists.

SUMMARY OF THE INVENTION

It is therefore one object of the invention to provide an auxiliary device for functional expansion and signal acquisition of a testing system, comprising a pogo pin attaching device including at least one spiral spring loop, at least one fastening member, and at least one cable; wherein the fastening member includes at least one limiting hole and at least one fastening hole; wherein the spiral spring loop is disposed in the limiting hole; and wherein the cable passes through the fastening hole to electrically connect to the spiral spring loop.

The invention has the following advantages and benefits in comparison with the conventional art:

The spiral spring loop of the pogo pin attaching device is put on a pogo pin. The spiral spring loop is designed to provide sufficient compression force. Thus, the spiral spring loop is not liable to disengage from the pogo pin. Further, they are securely attached together. Furthermore, there are annular contacts between the spiral spring loop and the pogo pin. And in turn, it effectively decreases contact resistance and ensures a good electrical contact.

The spiral spring loop has improved resilience and is adapted to expand or contract. Thus, the spiral spring loop has a reliable attaching effect with low risk to damaging the weak pogo pin. This is a safe and reliable attaching method.

Expansion slots or auxiliary ports of the automatic testing system are not required. Expandability can be made to a maximum extent. Expandability is not limited by the original design of the testing system.

The original design of the automatic testing system or the probe card is not modified. Thus, a user may remove the pogo pin attaching device at any time and easily return the automatic testing system to its original design. This expansion scheme is completely reversible.

No damage. The spiral spring loop of the invention is elastic in nature. The spiral spring loop may be elastically deformed in response to force exerted upon the auxiliary device. Further, the thin spring component of the spiral spring loop may be broken in response to abruptly pulling force exerted upon cable of the auxiliary device. As a result, the pogo pin interface of the testing system is kept intact.

The above and other objects, features and advantages of the invention will become apparent from the following detailed description taken with the accompanying drawings.

DETAILED DESCRIPTION OF THE INVENTION

Figure 1:
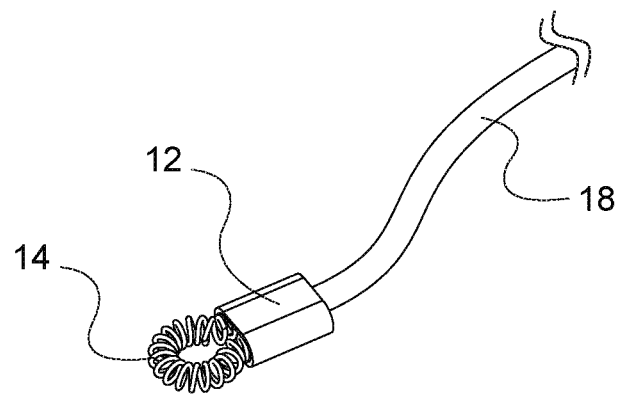
FIG. 1 is a perspective view of a pogo pin attaching device according to a first preferred embodiment of the invention.
Figure 2:
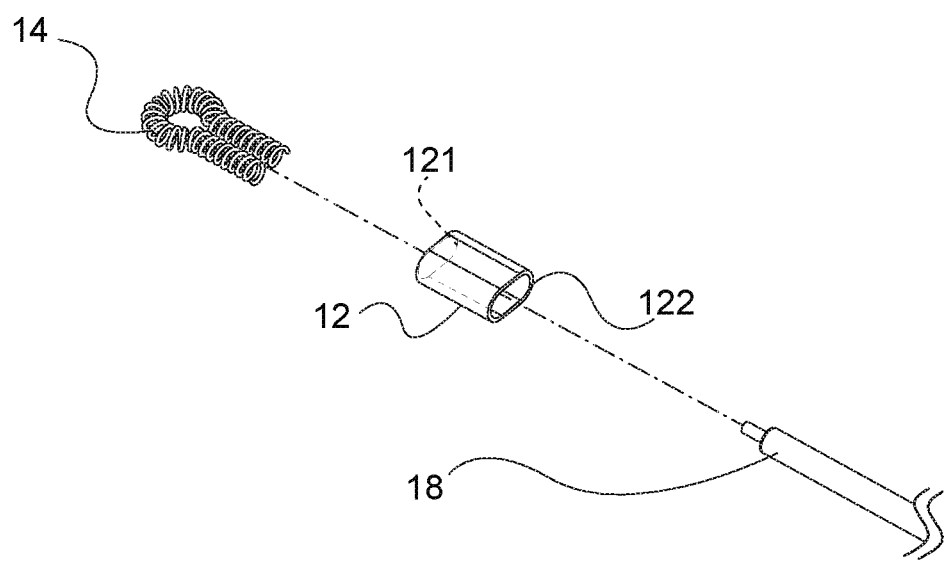
FIG. 2 is an exploded view of FIG. 1.

Referring to FIGS. 1 and 2, an auxiliary device for functional expansion and signal acquisition of a testing system in accordance with the invention is shown in which a pogo pin attaching device 10 of a first preferred embodiment is included. The pogo pin attaching device 10 comprises a fastening member 12, a spiral spring loop 14, and a cable 18. The spiral spring loop 14 is made of metal and is resilient in nature. The fastening member 12 is made of an appropriate material in a no manner. The sleeve-shaped fastening member 12 includes a limiting hole 121 at a first end and a fastening hole 122 at a second end. The spiral spring loop 14 has two ends, each disposed in the limiting hole 121, and one end of the cable 18 is disposed in the fastening hole 122. The cable 18 is electrically connected to the spiral spring loop 14 so that test signals can be transmitted from the spiral spring loop 14 to the cable 18. Further, the other end of the cable 18 can be, as desired, extended to electrically connect to an expansion instrument (not shown) for obtaining the purposes of expanding and upgrading the functions of the testing system.

Figure 3:
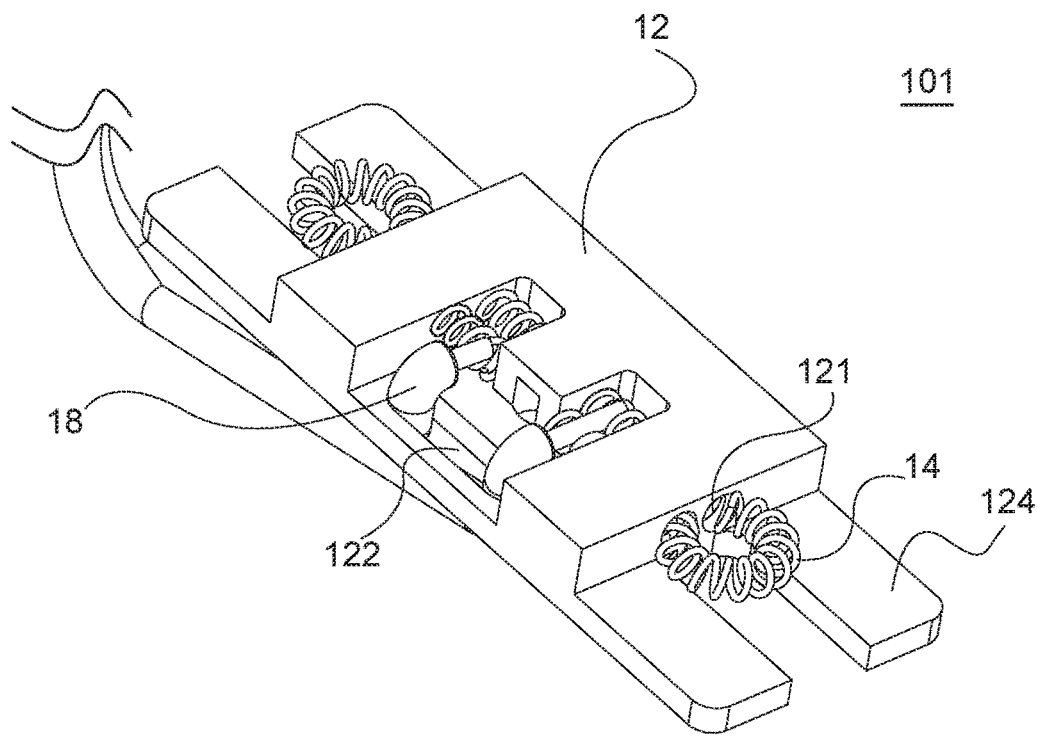
FIG. 3 is a perspective view of a pogo pin attaching device according to a second preferred embodiment of the invention.
Figure 4:
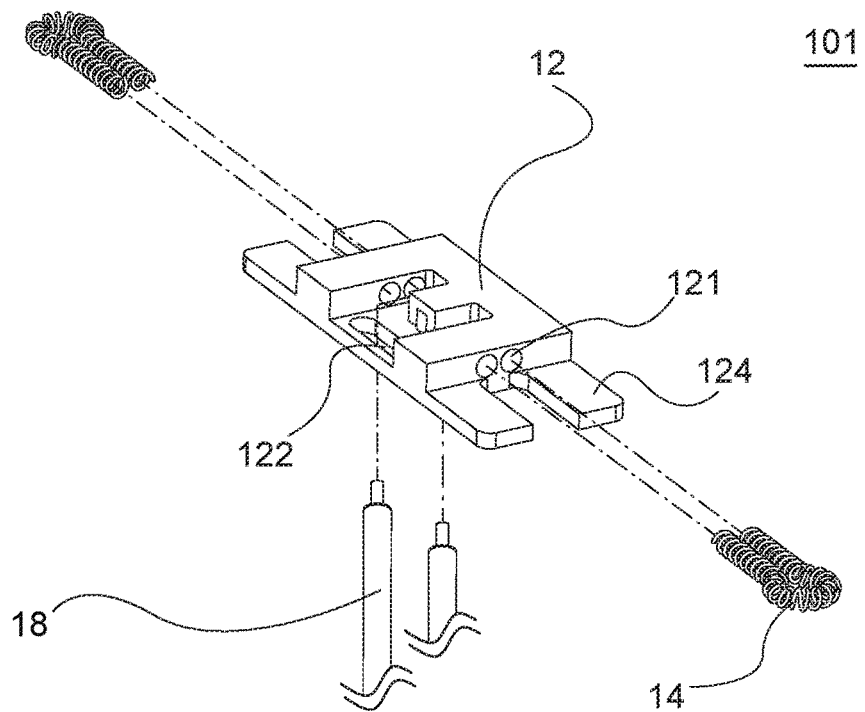
FIG. 4 is an exploded view of FIG. 3.

Referring to FIGS. 3 and 4, an auxiliary device for functional expansion and signal acquisition of a testing system in accordance with the invention is shown in which a pogo pin attaching device 101 of a second preferred embodiment is included. The pogo pin attaching device 101 comprises a fastening member 12, two spiral spring loops 14, and two cables 18. The spiral spring loops 14 are made of metal and are resilient in nature. The fastening member 12 is an electrical insulator. The elongated fastening member 12 includes a plurality of limiting holes 121 at two ends respectively, a fastening hole 122 through a bottom, and two sets of two parallel projections 124 at two ends respectively. Each spiral spring loop 14 has two ends fastened in the limiting holes 121 so as to position adjacent to or on the projections 124. An end of each cable 18 passes through the fastening hole 122 to electrically connect to one of the spiral spring loops 14 so that test signals can be transmitted from the spiral spring loops 14 to the cables 18. Further, the other end of each cable 18 can be, as desired, extended to electrically connect to an expansion instrument (not shown) for obtaining the purposes of expanding and upgrading the functions of the testing system.

Figure 5:
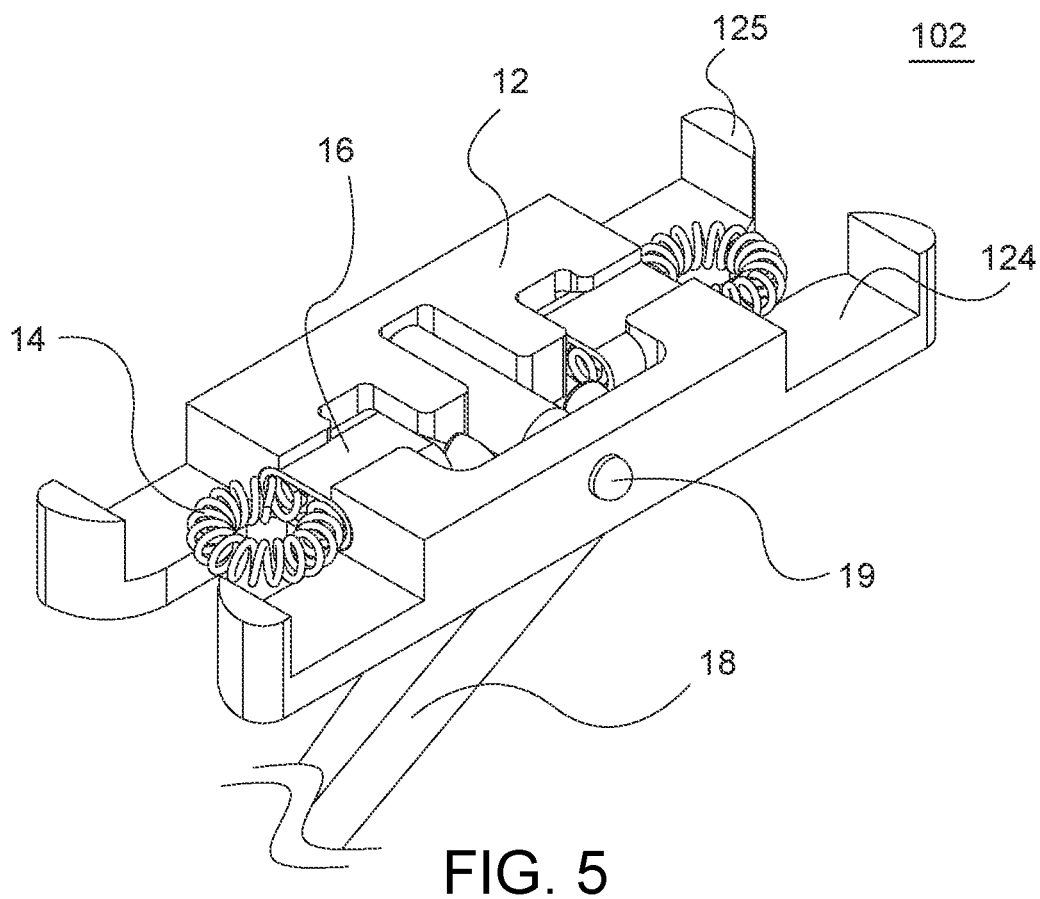
FIG. 5 is a perspective view of a pogo pin attaching device according to a third preferred embodiment of the invention.
Figure 6:
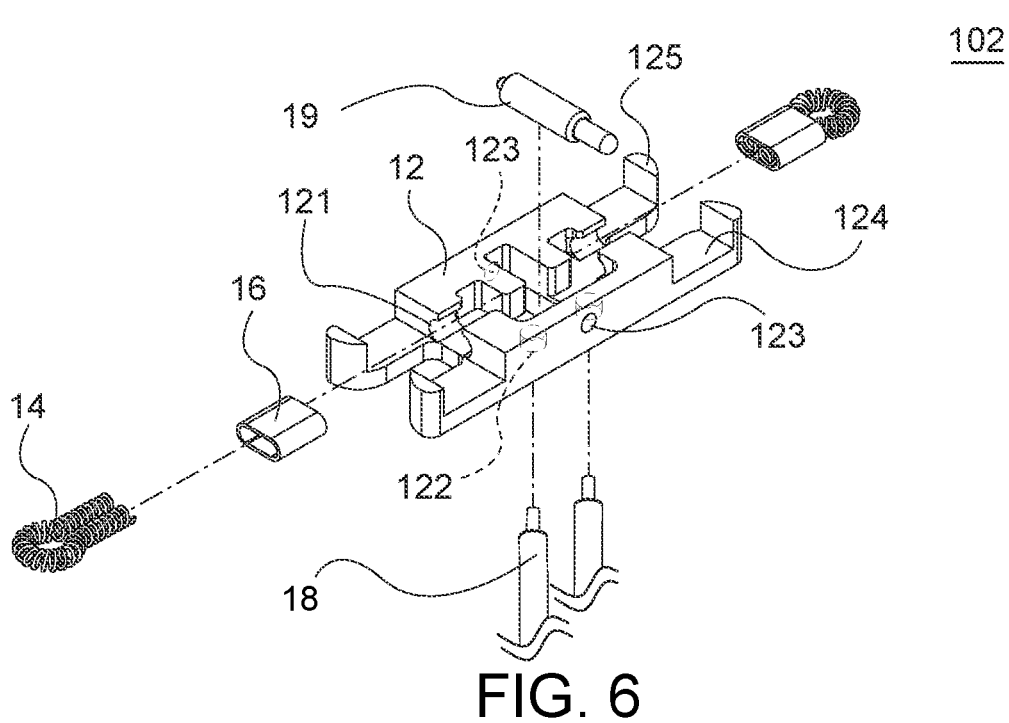
FIG. 6 is an exploded view of FIG. 5.

Referring to FIGS. 5 and 6, an auxiliary device for functional expansion and signal acquisition of a testing system in accordance with the invention is shown in which a pogo pin attaching device 102 of a third preferred embodiment is included. The pogo pin attaching device 102 comprises a fastening member 12, two spiral spring loops 14, and two cables 18. The fastening member 12 is an electrical insulator. The elongated fastening member 12 includes two limiting holes 121 at two ends respectively, two fastening holes 122 through a bottom, two hole members 123 through two sides respectively, a resilient member 19 having two ends positioned to the hole members 123 respectively and having at least one end extending out of the side of the fastening member 12, and two sets of two parallel projections 124 at two ends respectively. Each spiral spring loop 14 is fastened adjacent to or on the projections 124. A support 125 is provided at an end of each projection 124 and perpendicular to the projection 124. A top of each support 125 is flush with that of the fastening member 12. The spiral spring loops 14 are made of metal and are resilient in nature. A sleeve 16 is provided to cover an end of each spiral spring loop 14. The sleeve 16 is further compressed to fasten the spiral spring loop 14 prior to disposing in each limiting hole 121. The sleeves 16 are made of metallic or non-metallic material. Each spiral spring loop 14 is not necessarily engaged with the cable 18 if the sleeves 16 are made of metallic material. Thus, the metallic sleeves 16 are electrical conductors for achieving the purpose of electrical connection. Each spiral spring loop 14 is required to engage with the cable 18 for achieving the purpose of electrical connection if the sleeves 16 are made of non-metallic material. Each sleeve 16 is provided to fasten the spiral spring loop 14. The cables 18 are fastened in the fastening holes 122 respectively. The cables 18 are electrically connected to the spiral spring loops 14 respectively. An end of each cable 18 passes through the fastening hole 122 to electrically connect to one of the spiral spring loops 14 so that test signals can be transmitted from the spiral spring loops 14 to the cables 18. Further, the other end of each cable 18 can be, as desired, extended to electrically connect to an expansion instrument (not shown) for obtaining the purposes of expanding and upgrading the functions of the testing system.

Figure 7:
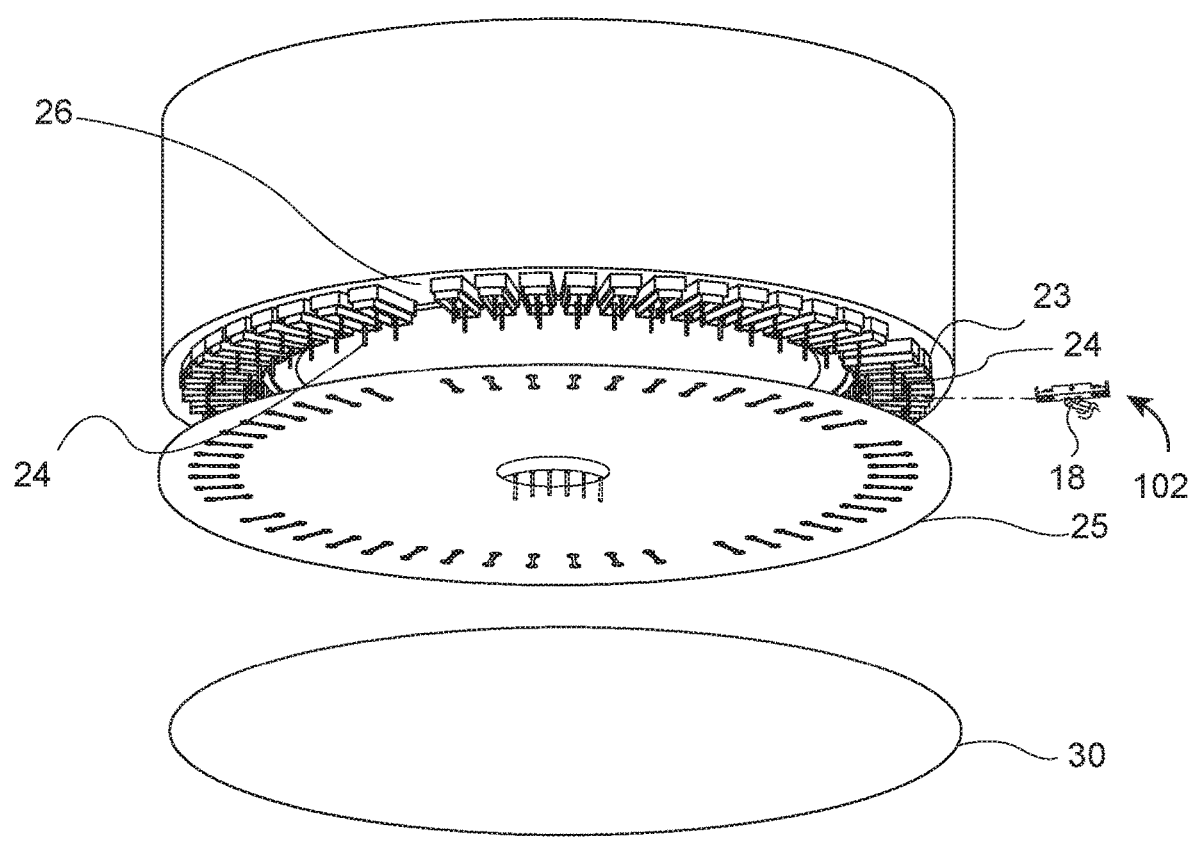
FIG. 7 schematically depicts the pogo pin attaching device of FIG. 5 ready to attach to a pogo pin interface of a testing system according to the invention.
Figure 8:
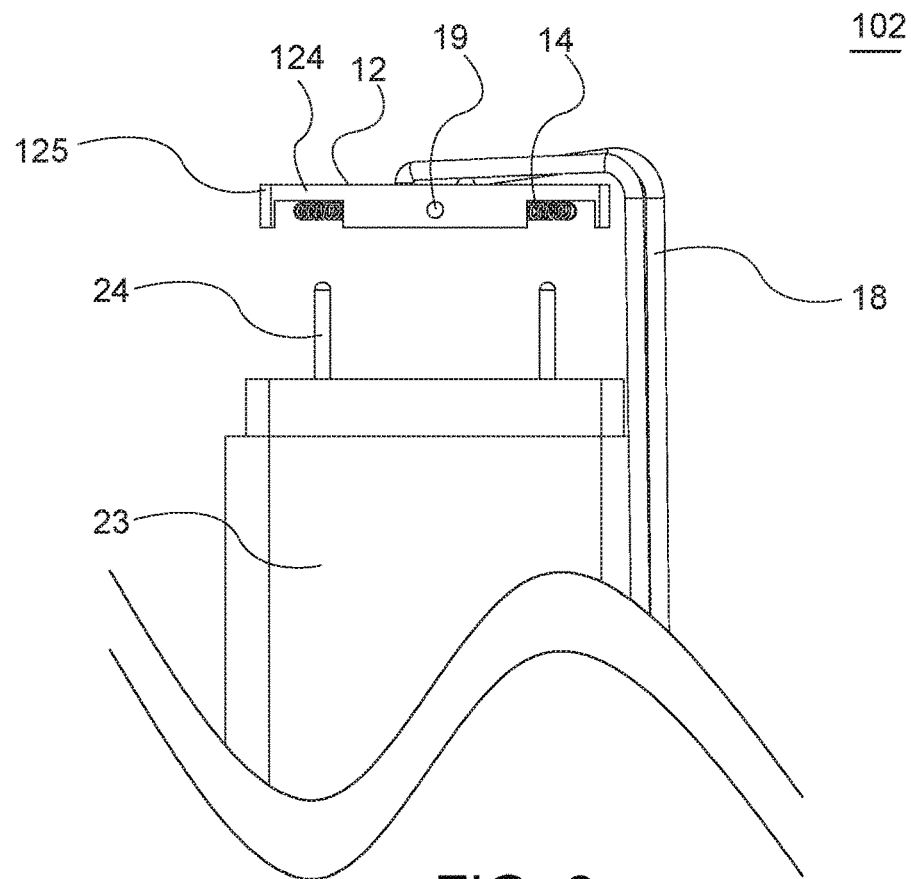
FIG. 8 schematically depicts an end view of the pogo pin attaching device of FIG. 5 mounted with a pogo pin of a pogo pin cartridge according to the invention.
Figure 9:
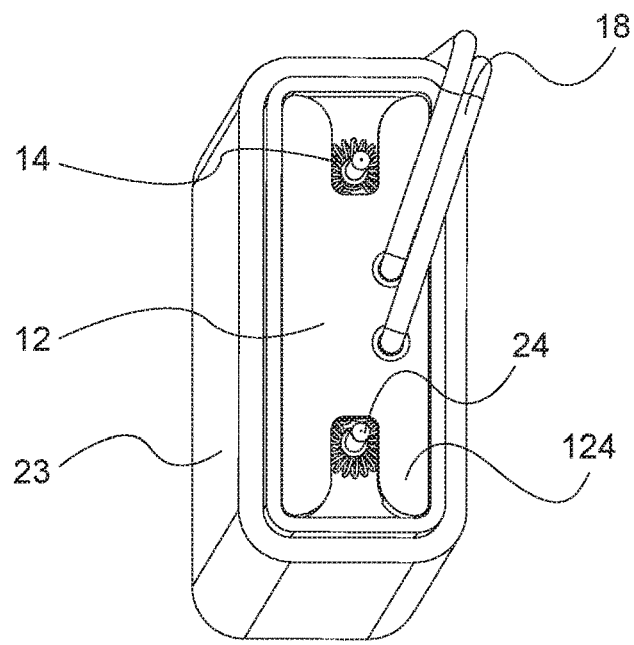
FIG. 9 is a perspective view schematically depicting the pogo pin attaching device of FIG. 5 mounted with the pogo pin cartridge shown in FIG. 8.

Referring to FIGS. 7 to 9 in conjunction with FIGS. 5 and 6, it schematically depicts the pogo pin attaching device 102 ready to attach to one of a plurality of pogo pin cartridges 23 of a pogo pin interface 26 according to the invention. The spiral spring loops 14 of the pogo pin attaching device 102 are put on a plurality of pogo pins 24 and the fastening member 12 is fastened in the pogo pin cartridge 23. The bottom ends of the pogo pins 24 are encircled and compressed by the spiral spring loops 14. The spiral spring loops 14 are urged against the projections 124 to withstand a pushing force during the urging step. Thus, with the cooperation of the projections 124 the corresponding spiral spring loop 14 is pushed onto the bottom end of each pogo pin 24. Further, the supports 125 urge against a bottom of the pogo pin cartridge 23 so as to secure the pogo pin attaching device 102 to the pogo pin cartridge 23. Thus, the cables 18 are electrically connected to both the pogo pins 24 and a probe card 25 under the pogo pins 24 by connecting to the spiral spring loops 14. Also, the other end of each cable 18 can be, as desired, extended to electrically connect to an expansion instrument (not shown). Therefore, a signal path is established between the expansion instrument and a subject 30 contacting the probe card 25 using the pogo pin attaching device 102. The resilient member 19 is resilient in nature. At least one end of the resilient member 19 is urged against an inner surface of either side of the pogo pin cartridge 23 when the pogo pin attaching device 102 and the pogo pin cartridge 23 are assembled. As a result, the pogo pin attaching device 102 and the pogo pin cartridge 23 are secured together.

Figure 10:
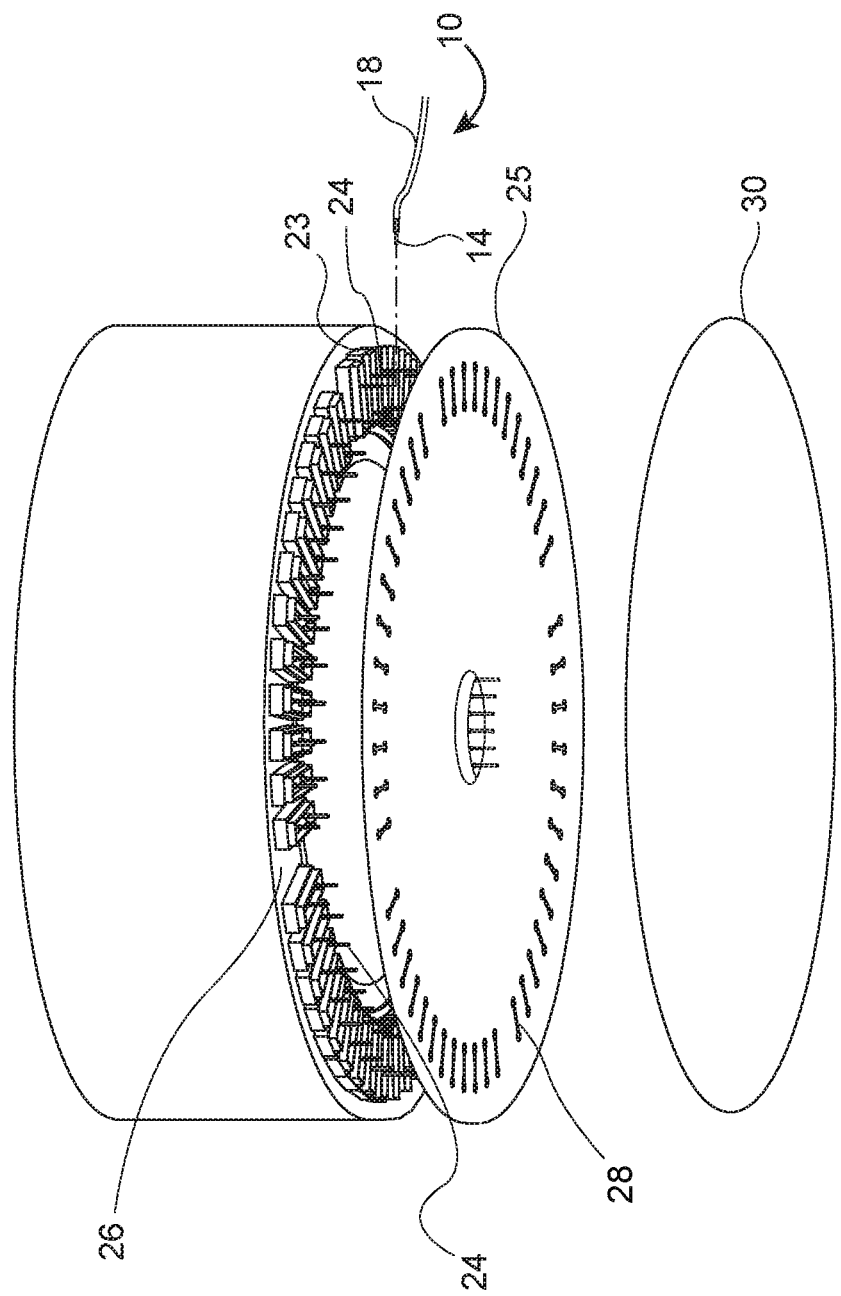
FIG. 10 schematically depicts the pogo pin attaching device of FIG. 1 ready to attach to the pogo pin interface of the testing system according to the invention.

Referring to FIG. 10 in conjunction with FIG. 1, it schematically depicts the pogo pin attaching device 10 ready to attach to one of the plurality of pogo pin cartridges 23 of the pogo pin interface 26 according to the invention. The spiral spring loop 14 of the pogo pin attaching device 10 is put on one of the plurality of pogo pins 24. The spiral spring loop 14 is designed to provide sufficient compression force. Thus, the spiral spring loop 14 is not liable to disengage from the pogo pin 24. Further, they are securely attached together. Furthermore, a vertical expansion or contraction of the pogo pin 24 is not adversely affected. The pogo pin interface 26 is lowered to urge against the probe card 25. Further, each pogo pin 24 contacts one of a plurality of electrical contacts 28 for transmitting signals. The testing signals are transmitted to or from the cable 18 via the spiral spring loop 14. The spiral spring loop 14 has sufficient resilience and is adapted to expand or contract. Thus, the spiral spring loop 14 has a reliable attaching effect and cannot damage the weak pogo pin 24. There are annular contacts between the spiral spring loop 14 and the pogo pin 24. And in turn, it effectively decreases contact resistance and ensures a good electrical contact.

While the invention has been described in terms of preferred embodiments, those skilled in the art will recognize that the invention can be practiced with modifications within the spirit and scope of the appended claims.

What is claimed is:

1. An auxiliary device for functional expansion and signal acquisition of a testing system, comprising:
   a pogo pin attaching device including at least one spiral spring having two ends, at least one fastening member, and at least one cable,
   wherein the fastening member includes at least one limiting hole and at least one fastening hole,
   wherein the spiral spring is bent such that the two ends of the spiral spring are disposed in the limiting hole to form a spiral spring loop, such that at least a part of the spiral spring is not straight but a curved spring, and
   wherein the cable passes through the fastening hole to electrically connect to the spiral spring loop.

2. The auxiliary device of claim 1, wherein the fastening member further comprises at least one projection at two ends respectively, and wherein the spiral spring loop is positioned adjacent to or on the projection.

3. The auxiliary device of claim 2, wherein an end of the projection includes a support having a top being flush with that of the fastening member.

4. The auxiliary device of claim 3, wherein the fastening member further comprises two hole members through two sides respectively, and a resilient member having two ends positioned adjacent to the hole members respectively and having at least one end extending out at least one of the sides of the fastening member.

5. The auxiliary device of claim 4, further comprising a sleeve covered an end of the spiral spring loop and disposed in the limiting hole.

6. The auxiliary device of claim 1, wherein the spiral spring loop is made of metallic material and has a predetermined elasticity.

* * * * *